(12) United States Patent
Pai

(10) Patent No.: US 6,493,238 B1
(45) Date of Patent: Dec. 10, 2002

(54) METHOD AND APPARATUS TO COMPLIANTLY INTERCONNECT AREA GRID ARRAYS AND PRINTED WIRING BOARDS

(75) Inventor: Deepak K. Pai, Burnsville, MN (US)

(73) Assignee: General Dynamics Information Systems, Inc., Bloomington, MN (US)

( * ) Notice: Subject to any disclaimer, the term of this patent is extended or adjusted under 35 U.S.C. 154(b) by 0 days.

(21) Appl. No.: 09/846,554

(22) Filed: Apr. 30, 2001

(51) Int. Cl.$^7$ .................................................. H01R 9/00
(52) U.S. Cl. ....................... 361/772; 361/743; 361/774; 361/760-761; 361/764; 361/790; 361/767; 361/803
(58) Field of Search .................................. 361/743, 767, 361/774, 772, 760, 761, 764, 790, 803, 785; 257/778, 780, 738, 737

(56) References Cited

U.S. PATENT DOCUMENTS

| | | | |
|---|---|---|---|
| 5,808,874 A | * | 9/1998 | Smith ........................... 361/769 |
| 6,324,754 B1 | * | 12/2001 | DiStefano et al. ............. 29/840 |
| 6,350,669 B1 | * | 2/2002 | Pu et al. ...................... 438/613 |

\* cited by examiner

*Primary Examiner*—David Martin
*Assistant Examiner*—Thanh Yen Tran
(74) *Attorney, Agent, or Firm*—Jenner & Block, LLC

(57) ABSTRACT

A method and system of utilizing inexpensively manufactured, electrically conductive and mechanically compliant disks to interconnect an area grid array ("AGA") chip to a printed wiring board. The conductive disk shaped leads are stamped from a thin sheet of conductive material. To increase solderability and protect the disk surface, the disks can be plated with tin or an equivalent material. Each disk is positioned tangent to the surface of an AGA chip in a specific orientation. One edge of each disk is electrically connected and mechanically secured to a corresponding conductive pad located on the surface of the AGA chip. The opposite edge of each conductive disk is positioned to align with a corresponding conductive surface pad on a printed wiring board ("PWB"). Each opposite edge is electrically connected and mechanically secured to the surface of the PWB, thereby establishing a compliant electrical connection between the AGA chip and the PWB.

20 Claims, 2 Drawing Sheets

US 6,493,238 B1

METHOD AND APPARATUS TO COMPLIANTLY INTERCONNECT AREA GRID ARRAYS AND PRINTED WIRING BOARDS

BACKGROUND OF THE INVENTION

1. Field of the Invention

The present invention relates generally to the mounting and connecting of devices and, more particularly, to the mounting and connecting of microelectronic units, such as semiconductor chips, on printed wiring boards.

2. Description of the Prior Art

Early methods of mounting and connecting semiconductor chips to printed wire boards frequently resulted in unreliable connections. Specifically, the early methods provided an electrical connection between a semiconductor chip and a printed wire board that consisted of a solder joint. Although suitable for normal environments, such as desk top use, this type of connection proved unreliable in external environments that subjected the board and chip to vibrations and temperature variations. The vibrations frequently caused fatigue failures in the solder joints. Temperature variations caused connection failures due to the difference in the thermal coefficients of expansion ("TCE") for the semiconductor chips and the printed wiring board ("PWB"). A material's TCE is the rate at which the material expands or contracts in relation to its temperature. Printed wiring boards, for example, frequently have a TCE that is about three times greater than the TCE for semiconductor chips. This difference in the TCE between the semiconductor chip and PWB frequently caused solder joint strain on early chip mounted boards often interrupting the electrical connections between the chip and the printed wiring board.

To solve this problem, manufacturers developed improved methods of connecting semiconductor chips to printed wiring boards. For example, manufacturers developed peripheral grid array ("PGA") chips configured to have leads arranged about the chip's periphery. The PGA chip design initially incorporated S-shape leads to compensate for the differing TCE between the PGA chip and the PWB. See U.S. Pat. Nos. 4,827,611; 5,294,039; and 5,317,479.

However, the drive to miniaturize semiconductor chip and PWB assemblies soon led to the development of C-shaped leads, as the S-shaped lead left too much space between the surface of the PWB and the semiconductor chip. The C-shaped lead reduced the spacing between the surface of the chip and the PWB and thus provided a chip with a lower profile, when mounted, than a chip equipped with S-shaped leads. Reducing the lead length also enhanced performance by correspondingly reducing lead inductance. When used in external environments that subjected the mounted assembly to vibration and wide temperature variations, the C-shape retained the lead's ability to compensate for the differing TCE of the chip and printed wiring board.

Prior to the advent of area grid array ("AGA") semiconductor chips, the C-shaped lead and the S-shaped lead proved adequate in dealing with the problem of differing TCE between semiconductor chips and printed wiring boards. With AGA chips, however, the conductive connecting surface pads of the chip are arranged in a matrix. Each connecting surface pad in the matrix is electrically coupled to a similar conductive pad located within a reciprocal corresponding matrix on the PWB. The AGA chip is connected typically to the PWB via solder joints, each of which is individually formed into a spherical shape. AGA chips employing the typical solder ball joints are sometimes referred to as ball grid arrays ("CBGA").

FIGS. 1 and 2 illustrate a prior art BGA. FIG. 1 illustrates an AGA chip 50 connected to a printed wiring board 70 using solder balls 90 and solder joints 55 and 77. Solder balls 90 are typically made from conventional solder such as Sn63:Pb37, i.e., 63 weight percent tin and 37 weight percent lead, or Sn10:Pb90, i.e., 10 weight percent tin and 90 weight percent, or an equivalent alloy. Typically, plastic BGA ("PBGA") packages use the more common Sn63:Pb37 solder balls and ceramic BGA ("CBGA") packages use Sn10:Pb90 solder balls. However, like the original semiconductor solder joints, solder ball joints are not very reliable when AGA chip 50 and PWB 70 are subjected to temperature variations and/or mechanical vibration.

Moreover, once AGA chip 50 is mounted on PWB 70, accessing a connection point between a single conductive pad on AGA chip 50 and a reciprocal conductive pad on PWB 70 is difficult. When a solder ball joint fails, the entire AGA chip 50 must be removed from PWB 70 in order to effect repairs. While BGA packages have provided space reduction between the chip and PWB, the reliability problems associated with solder joints between semiconductor chips and printed wiring boards have continued.

One attempted solution includes the use of solder columns instead of solder balls. The solder columns are typically made of Sn10:Pb90 solder alloy. Although solder columns enhance compliancy, the columns bend easily and often experience problems as a result of handling during production. Solder columns also fail to provide improved strength or reliability over solder balls. In addition, the high lead content of this solder alloy is highly undesirable due to environmental concerns over the introduction of additional lead into the environment.

Attempts have been made to use a conductive lead to connect an AGA chip to a PWB. For example, U.S. Pat. No. 5,455,390 discloses a method for placing a plurality of conductive connecting leads between the conductive surface pads of the AGA chip and the connecting surface pads of the PWB. However, this method still results in connection failures due to the less reliable type of material, e.g., gold, used to make the conductive connecting leads.

U.S. Pat. No. 6,000,126 issued to the present inventor discloses an improved method of interconnecting an AGA chip to a PWB. This method includes orienting a first side of a matrix of a plurality of conductive leads, secured relative to one another in parallel by an insulating carrier, so that the first ends of the matrix are aligned with a reciprocating matrix of conductive surface pads on an AGA chip. The leads are electrically connected to the connecting surfaces of the AGA chip. The second side of the matrix of leads is oriented so that the second ends are aligned with a reciprocating matrix of connecting surface pads on a PWB. The leads of the second side of the lead matrix are electrically connected to the connecting surface pads of the PWB thereby establishing an electrical connection between the AGA chip and the PWB.

While the method described in U.S. Pat. No. 6,000,126 offers substantial advantages over the prior art, implementation remains relatively expensive due to manufacturing issues and the availability of materials. Also, minimum lead length required for automatic insertion into an insulating carrier may be too long to accommodate some high density, high performance electronic requirements. In addition, most copper alloys used for drawing the leads for the automatic insertion process have relatively low thermal conductivity and thus exacerbate thermal management problems associated with high power components.

Thus, it would be desirable to have an inexpensive means to interconnect an AGA chip with a PWB that maintains high operational reliability across a vast range of operating temperatures and mechanical stresses.

BRIEF SUMMARY OF THE INVENTION

The present invention comprises a method of utilizing inexpensively manufactured, electrically conductive and mechanically compliant disks to interconnect an area grid array chip to a printed wiring board. An automated punch press can be used to stamp disks from a thin sheet of conductive material. The conductivity of the material should be at least 270 kilo mho-cm. To increase solderability and protect the disk surface from oxidation, the disks can be plated with tin or an equivalent material. Conductive pads are located on the surface of an AGA chip in a specific orientation. Each disk is positioned tangent to a corresponding conductive pad. The preferred method of connecting the conductive disks to an AGA chip includes aligning a plurality of conductive disks, secured relative to one another by a rigid nest, in an orientation that corresponds to the specific orientation of the pads on the AGA chip surface. One edge of each disk is then electrically connected and mechanically secured to the connecting surface of the AGA chip. Next, the securing nest is removed. The opposite edge of each conductive disk, that is the point 180° from the point tangent to the AGA chip, is then in position to align with a corresponding conductive surface pad on a PWB. The opposite edge of each conductive disk is then electrically connected and mechanically secured to its corresponding connecting pad located on the surface of the PWB, thereby establishing a compliant electrical connection between the AGA chip and the PWB.

In a preferred embodiment, the thin conductive disks of the present invention have an aspect ratio, i.e., the ratio of disk diameter to disk thickness, of about 3.5 to about 10. Thin conductive disks provide more mechanical compliancy than the high temperature solder balls or conductive wire leads well known in the art, and thus can better accommodate TCE mismatch between ceramic components, solder joints, and printed wiring boards. This capability enables electronic assemblies incorporating the disks and method of the present invention to operate reliably over a wide temperature range. In a preferred embodiment, copper disks provide the additional thermal and electrical conductivity required by ever more robust components that consume ever increasing amounts of power. However, conductive disks formed from any material with tensile and shear strength comparable to that of copper, silver, and aluminum and having a conductivity of at least 270 kilo mho-cm will work.

Using an automated hole punching press, disks can be fabricated with tight mechanical tolerances, typically on the order of +/−0.0005 inches or less. By comparison, solder balls have diameter tolerances that typically vary from +/−0.0007 inch to +/−0.003 inch. Tighter mechanical tolerances improve the coplanarity of components, which in turn improves solder joint uniformity, thereby further enhancing reliability. The disks are also lighter in weight than lead solder balls of equal diameter.

In addition to enhancing electrical and thermal conductivity and reliability in both favorable and unfavorable external environments, the conductive disks of the present invention offer an inexpensive method of replacing the conductive solder balls of a BGA with lead-free, more environmentally friendly metals. Disk grid arrays thus provide an economically feasible way to advance the lead-free initiatives advocated by many governments around the globe. The present invention can use "lead-free" solder and can be easily applied to new ceramic chip scale packages ("CCSP") and plastic grid arrays ("PGA").

In alternative embodiments of the present invention, the disks may be attached by solder, conductive adhesives, or socket or compression fittings.

DETAILED DESCRIPTION OF THE PREFERRED EMBODIMENT

Figure 1:
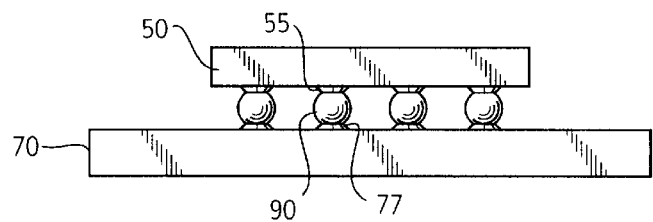
FIG. 1 is elevation view of a prior art ball grid array interconnecting a chip to a printed wiring board.
Figure 2:
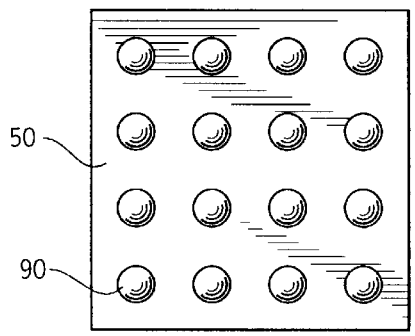
FIG. 2 is a plan view of the prior art ball grid array and chip of FIG. 1.
Figure 3:
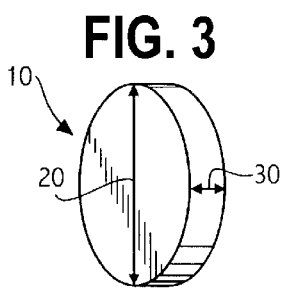
FIG. 3 is a perspective view of an electrically conductive disk of the present invention.

Referring to FIG. 3, a conductive disk 10 is shown having a diameter and a thickness 30. Disk 10 preferable is stamped from a thin plate or sheet of conductive material. In a preferred embodiment, disk 10 is formed from copper. Alternatively, disk 10 can be formed from any material with tensile and shear strength comparable to that of copper, silver, and aluminum and having a conductivity of at least 270 kilo mnho-cm. Preferably, disk 10 is plated with tin or an equivalent material to increase solderability and to protect the disk surface. By way of example, a ceramic area grid array with 1.27 mm pitch can use disk 10 having diameter 20 of 0.9 mm and thickness 30 of 0.125 mm made from C-17410 copper alloy, or equivalent, plated with "White Tin" or Sn97:Pb3 alloy.

Figure 4:
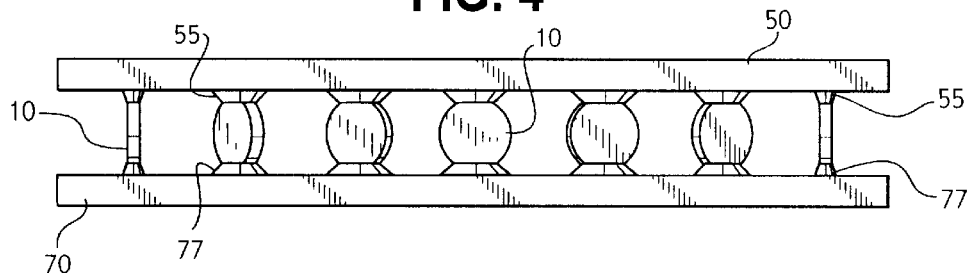
FIG. 4 is an nelevation view of a chip mounted on a printed wiring board in accordance with the present invention.

Referring now to FIG. 4, there is shown a plurality of disks 10 for interconnecting an AGA 50 and a PWB 70. In order to accommodate different TCEs between the various interconnected components, disks 10 provide a mechanically compliant electrical interconnection between AGA 50 and PWB 70 via a plurality of solder joints 55 and 77. In the preferred embodiment illustrated in FIGS. 5 and 6, each conductive disk 10 is aligned on AGA 50 in a specific orientation. For illustrative purposes, a center point 51 is shown on AGA 50, as well as a plurality of lines 65 emanating from center 51. Lines 65 reside in the plane defined by the surface of AGA 50. Each disk 10 is oriented such that the respective line 65 for that disk extends from center 51 to a point located on or tangent to the largest surface area of each disk 10 facing center 51. In the preferred embodiment, a 90° angle exists (in the plane defined by AFA 50) at the intersection of the plane defined by the surface of each disk 10 with the line 65 defined by center 51 of AGA 50 and the point on disk 10 closest to center 51.

Aligning the conductive disks in this manner allows for higher conductor density without violating minimum spacing guidelines, which typically are on the order of 0.125 mm. Optimizing the spacing between the individual disks in this way allows for maximum conductor bending and contracting caused by thermal variations. Solder joint quality and reliability is enhanced by the coplanarity of the present invention's disk grid array ("DGA"), which is typically within 0.001 inch as compared to a typical ball grid array ("BGA") coplanarity of 0.004 inch. The conductor's disk shape also results in a shortened conductor length, which in turn reduces conductor inductance.

Figure 7:
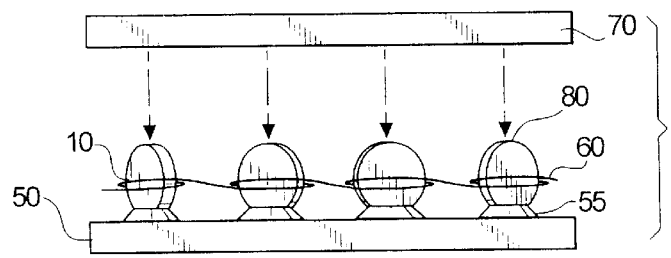
FIG. 7 is an exploded view of a chip being mounted on a printed wiring board in accordance with the present invention.

FIG. 7 illustrates a preferred method of incorporating the conductive disks of the present invention into an electronic assembly. First, AGA 50 is prepared by attaching solder joints 55 at the desired points along its surface preferably using the stenciling method described by the present inventor in issued U.S. Pat. No. 6,000,126, the contents of which are hereby incorporated by reference. A rigid support nest 60 preferably is used to secure disks 10 in a predetermined position during soldering to AGA 50. Support nest 60 itself preferably is constructed from material to which solder does not stick, for example, stainless steel or graphite. In a preferred implementation, a solder alloy consisting essentially of tin 96.5% to silver 3.5% (Sn96.5:Ag3.5) with a melting point of about 221° C. is used to attach disks 10 to AGA 50 at solder joints 55. The solder alloy preferably has a minimum tensile and shear strength of 3500 psi and a minimum conductivity of 60 kilo mho-cm. Support nest 60 is removed once disks 10 are soldered at solder joints 55 of AGA 50.

Figure 8:
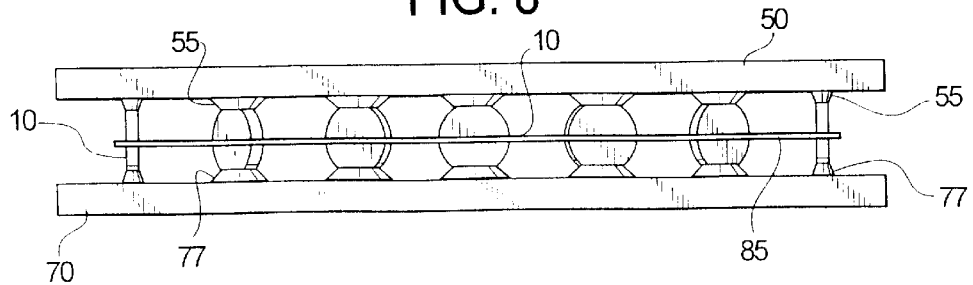
FIG 8 is an elevation view of the present invention's disk grid array with an optional dielectric carrier.

The same stenciling method referred to above then can be used to prepare the corresponding PWB 70 shown in FIG. 7 with solder paste located so as to secure the opposite ends 80 of disks 10 to PWB 70. In a preferred implementation, a solder alloy consisting essentially of tin 63% to lead 37% (Sn63:Pb37) alloy with a melting point of about 187° C. or an equivalent low temperature solder alloy, is used to attach disks 10 to PWB 70 at solder joint 77, as shown in FIG. 8. Use of a solder alloy having a relatively low melting point for solder joint 77 (compared to solder joint 55) helps to prevent melting of previously formed solder joint 55 that secures the opposite end of disk 10 to AGA 50. This process is known in the art as "step soldering." Of course, solder joint 77 can be made prior to solder joint 55. In this case, it would be preferable to use a solder alloy having a relatively high melting point to make solder joint 77 and a solder having a relatively low melting point to make solder joint 55.

Other methods can be used to incorporate the conductive disks of the present invention into an electronic assembly similar to that shown in FIG. 4. These methods include, but are not limited to, using the same solder at all points of attachment, mechanically securing disks 10 to conductive areas on either or both AGA chip 50 and PWB 70, applying conductive adhesives to all attached ends of disks 10, and securing disks 10 into mating sockets located to replace solder joints 55 and 77. The electrical interconnection of disk 10 to both AGA 50 and PWB 70 preferably should withstand minimum tensile and shear forces of 3500 psi and have a minimum conductivity of 60 kilo mho-cm. Using the same solder alloy at all electrical interconnection points requires using a carrier made from a thin, for example, about 0.005 inch, insulating material for holding disks 10 in place during the entire soldering process. FIG. 8 shows a slotted, insulated carrier 85 used when disks 10 are connected at interconnection points 55 and 77 with the same solder alloy.

Insulated carrier 85 is optional, but can be used to secure disks 10 during soldering to both AGA 50 and PWB 70.

Figure 5:
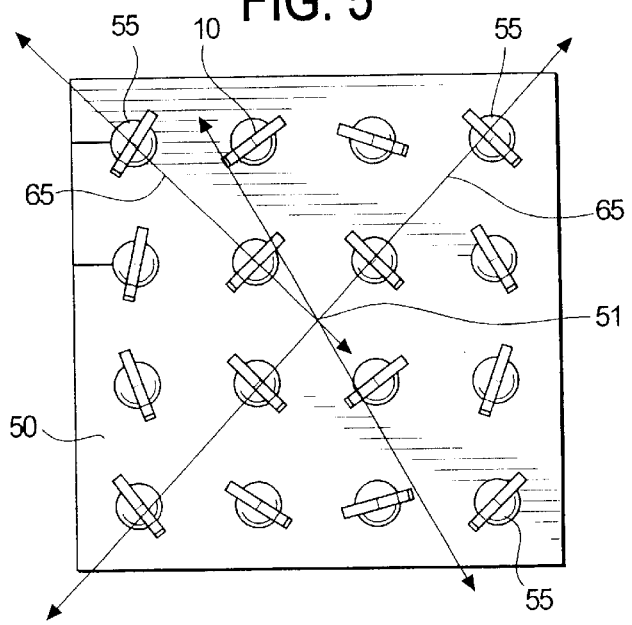
FIG. 5 is a plan view of conductive disks soldered to an AGA in accordance with the present invention.
Figure 6:
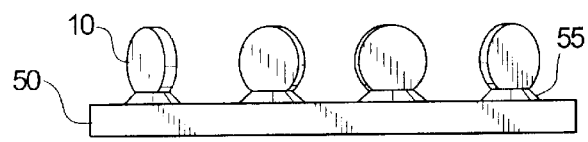
FIG. 6 is an nelevation view of conductive disks soldered to a chip as shown in FIG. 5 in accordance with the present invention.

When used to interconnect AGA chips and PWBs, the conductive disks are ideally oriented perpendicular to the radial axis of the AGA components as shown in FIG. 5. The orientation of the disks on the DGA components potentially minimizes cross-talk problems. The disk-shaped leads provide relatively high compliance when subjected to stresses caused by TCE mismatch. This compliance reduces stresses on the solder joints and enhances the reliability of electronic systems that incorporate the DGA packages of the present invention. The DGA invention also minimizes lead length and thus lead inductance thereby further enhancing electrical performance. In addition, conductive disks enhance thermal conductivity between the AGA component and PWB which reduces junction temperature and improves reliability.

The present invention's DGA also provides higher coplanarity for AGA components compared to that associated with solder balls. Higher coplanarity produces uniform joints thus enhancing mechanical reliability. The invention can be applied to most grid array component families, including PBGA, CSP, and tape ball grid array (TBGA). The invention can utilize lead-free alloys.

Whereas the present invention has been described with respect to specific embodiments thereof, it will be understood that various changes and modifications will be suggested to one skilled in the art and it is intended that the invention encompass such changes and modification as fall within the scope of the appended claims.

I claim:

1. A method of connecting an area grid array semiconductor chip to a printed wiring board, comprising the steps of:
    providing at least one disk-shaped conductive lead having a first edge located on the circumference thereof and a second edge located on the circumference thereof, said second edge being located substantially diametrically. opposite said first edge;
    orienting said first edge of said at least one disk-shaped conductive lead tangent to a corresponding first conductive connection point located on a surface of one of said area grid array semiconductor chip and said printed wiring board;
    electrically connecting said first edge of said at least one disk-shaped conductive lead to said corresponding first conductive connection point;
    orienting said second edge of said at least one disk-shaped conductive lead tangent to a corresponding second conductive connection point located on a surface of the other of said area grid array semiconductor chip and said printed wiring board; and
    electrically connecting said second edge of each of said at least one disk-shaped conductive leads to said corresponding second conductive connection point.

2. The method of claim 1 wherein said at least one conductive disk-shaped lead is oriented substantially perpendicular to said area grid array semiconductor chip.

3. The method of claim 1 wherein said at least one conductive disk-shaped lead is oriented substantially perpendicular to said printed wiring board.

4. The method of claim 1 further comprising the step of:
    arranging said at least one disk-shaped lead within a carrier having at least one slot arranged in a predetermined orientation and sized to accommodate said at least one disk-shaped conductive lead.

5. The method of claim 4 further comprising the step of removing said carrier after electrically connecting said first edge of said at least one disk-shaped conductive lead.

6. The method of claim 4 wherein said carrier is made of electrically nonconductive material.

7. A method of connecting an area grid array semiconductor chip to a printed wiring board, comprising the steps of:
   providing a plurality of disk-shaped conductive leads, each of said leads having a first edge located on the circumference thereof and a second edge located on the circumference thereof, said second edge being located substantially diametrically opposite said first edge;
   orienting said first edge of each of said plurality of disk-shaped conductive leads tangent to a corresponding first conductive connection point located on a surface of one of said area grid array semiconductor chip and said printed wiring board;
   electrically connecting said first edge of each of said plurality of disk-shaped conductive leads to said corresponding first conductive connection point;
   orienting said second edge of each of said plurality of disk-shaped conductive leads tangent to a corresponding second conductive connection point located on a surface of the other of said area grid array semiconductor chip and said printed wiring board; and
   electrically connecting said second edge of each of said plurality of disk-shaped conductive leads to said corresponding second conductive connection point.

8. The method of claim 7 wherein each of said plurality of conductive disk-shaped leads is oriented substantially perpendicular to said area grid array semiconductor chip.

9. The method of claim 7 wherein each of said plurality of conductive disk-shaped leads is oriented substantially perpendicular to said printed wiring board.

10. The method of claim 7 further comprising the step of:
    arranging each of said plurality of disk-shaped leads within a carrier having a corresponding plurality of slots arranged in a predetermined orientation for maintaining said plurality of disk shaped conductive leads in a predetermined orientation relative to one another, to said area grid array semiconductor chip, and to said wiring board, each of said slots sized to accommodate a corresponding one of said plurality of disk-shaped conductive leads.

11. The method of claim 10 further comprising the step of removing said carrier after electrically connecting said first edge of each of said plurality of disk-shaped conductive leads.

12. The method of claim 10 wherein said carrier is made of electrically nonconductive material.

13. A disk grid array assembly, comprising:
    an area grid array semiconductor chip having a first plurality of conductive connection points arranged in a first predetermined orientation on a surface thereof;
    a printed wiring board having a second plurality of conductive connection points arranged in a second predetermined orientation on a surface thereof, said second predetermined orientation corresponding to said first predetermined orientation;
    a plurality of disk-shaped conductive leads, each of said leads having a first edge located on the circumference thereof and a second edge located on the circumference thereof, said second edge being located substantially opposite said first edge;
    said plurality of disk-shaped leads arranged in a third predetermined orientation corresponding to each of said first and second predetermined orientations;
    said first edge of each of said plurality of conductive disk-shaped leads electrically connected tangent to a corresponding one of said first plurality of conductive connection points; and
    said second edge of each of said plurality of conductive disk-shaped leads electrically connected tangent to a corresponding one of said second plurality of conductive connection points.

14. The apparatus of claim 13 wherein each of said plurality of conductive disk-shaped leads is substantially perpendicular to said surface of said area grid array semiconductor chip and to said surface of said printed wiring board.

15. The apparatus of claim 13 further comprising a carrier for maintaining said plurality of conductive disk shaped leads in said third predetermined orientation.

16. The disk grid array of claim 15 wherein said carrier is made of electrically nonconductive material.

17. A disk grid array assembly, comprising:
    an area grid array semiconductor chip having a first plurality of conductive connection points arranged in a first predetermined orientation on a surface thereof;
    a printed wiring board having a second plurality of conductive connection points arranged in a second predetermined orientation on a surface thereof, said second predetermined orientation corresponding to said first predetermined orientation;
    a plurality of disk-shaped conductive leads, each of said leads having a first edge located on the circumference thereof and a second edge located on the circumference thereof, said second edge being located substantially opposite said first edge;
    said plurality of disk-shaped leads arranged in a third predetermined orientation corresponding to each of said first and second predetermined orientations;
    means for electrically connecting said first edge of each of said plurality of conductive disk-shaped leads tangent to a corresponding one of said first plurality of conductive connection points; and
    means for electrically connecting said second edge of each of said plurality of conductive disk-shaped leads tangent to a corresponding one of said second plurality of conductive connection points.

18. The apparatus of claim 17 wherein each of said plurality of conductive disk-shaped leads is substantially perpendicular to said surface of said area grid array semiconductor chip and to said surface of said printed wiring board.

19. The apparatus of claim 17 further comprising a carrier for maintaining said plurality of conductive disk shaped leads in said third predetermined orientation.

20. The disk grid array of claim 19 wherein said carrier is made of electrically nonconductive material.

* * * * *

UNITED STATES PATENT AND TRADEMARK OFFICE
CERTIFICATE OF CORRECTION

PATENT NO.    : 6,493,238 B1
DATED         : December 10, 2002
INVENTOR(S)   : Deepak K. Pai It is certified that error appears in the above-identified patent and that said Letters Patent is hereby corrected as shown below:

Column 2,
Line 2, delete "CBGA" and insert -- BGA --

Column 4,
Lines 18 and 23, delete "nelevation" and insert -- elevation --
Line 36, delete "diameter" and insert -- diameter 20 --

Signed and Sealed this

Eighteenth Day of March, 2003

JAMES E. ROGAN
*Director of the United States Patent and Trademark Office*